(12) United States Patent
Ostergaard

(10) Patent No.: US 6,734,750 B1
(45) Date of Patent: May 11, 2004

(54) SURFACE MOUNT CROSSOVER COMPONENT

(75) Inventor: Hans Peter Ostergaard, Jamesville, NY (US)

(73) Assignee: Anaren Microwave, Inc., East Syracuse, NY (US)

( * ) Notice: Subject to any disclaimer, the term of this patent is extended or adjusted under 35 U.S.C. 154(b) by 0 days.

(21) Appl. No.: 09/466,288

(22) Filed: Dec. 17, 1999

(51) Int. Cl.⁷ .............................. H01P 5/02; H01P 3/08
(52) U.S. Cl. ............................................. 333/1; 333/246
(58) Field of Search ...................................... 333/1, 246

(56) References Cited

U.S. PATENT DOCUMENTS 4,821,007 A    4/1989  Fields et al. ................. 333/238
5,117,207 A  * 5/1992  Powell et al. ................... 333/1
5,321,375 A    6/1994  Corman ....................... 333/246
5,600,285 A  * 2/1997  Sachs et al. .................... 333/1
6,097,260 A  * 8/2000  Whybrew et al. .............. 333/1

FOREIGN PATENT DOCUMENTS

JP            4165701    * 6/1997  ................. 333/246

* cited by examiner

*Primary Examiner*—Benny Lee
(74) *Attorney, Agent, or Firm*—Robert J. Sinnema; Bond, Schoeneck & King, PLLC

(57) ABSTRACT

A surface mount crossover component comprising first and second conductor lines electrically isolated from one another by an interposed dielectric layer and capacitively isolated from one another by an interposed ground plane layer. Current flowing through the crossover component via one of the conductor lines encounters no substantial interference from current flowing through the other one of the conductor lines.

6 Claims, 3 Drawing Sheets

SURFACE MOUNT CROSSOVER COMPONENT

FIELD OF THE INVENTION

The present invention relates to a surface mount crossover component for use as a discrete component in an integrated circuit where two signal lines cross one another, and in particular, a surface mount crossover component for use in an integrated circuit where an RF signal line crosses a DC line.

BACKGROUND OF THE INVENTION

There are many instances in the design of integrated circuits where signal lines must cross one another. In the field of wireless communications, for example, an integrated circuit includes RF signal lines and DC lines, wherein the RF lines carry the communication signal and the DC line controls and supplies power to solid state components of the circuit, such as semiconductor amplifier components.

It is known that the RF signal carried by the RF line is adversely affected by the presence of the DC current carried by the DC line at points where the two lines approach one another, and especially where the two lines cross one another. Accordingly, many attempts have been made to isolate the two lines from one another. One example of isolating the lines when they cross one another is disclosed in U.S. Pat. 5,321,375, which describes an RF crossover network that includes an RF line capacitively coupled to an overlying DC line through an interposed dielectric layer. The problem with this crossover network, however, is that the structure of the DC line must be controlled precisely to insure the appropriate capacitive coupling between the DC line and the RF line. Such precise control inevitably makes the device more difficult to manufacture, and consequently increases the cost of production.

Other attempts to isolate RF and DC lines from one another have been incorporated in the design of the overall integrated circuit board. The '375 patent explains that it is common in the design of integrated circuit boards to incorporate multi-layer substrate techniques when building the circuit board itself, wherein the DC lines for the integrated circuit are formed on one dielectric layer, and the RF signal lines are formed on a different dielectric layer to provide electrical isolation between the two lines. It is also common, as explained in the '375 patent, to incorporate a ground plane within the multi-layer integrated circuit board to provide capacitive isolation between the DC lines and the RF signal lines. The '375 patent explains, however, that such multi-layer integrated circuit boards are time consuming and costly to produce, and require more material as a result of the separate ground plane provided within the circuit board between the DC lines and RF signal lines.

Another problem with this conventional technique, however, is that the designer is required to plan and arrange the DC lines for the entire integrated circuit board with respect to the location of the RF signal lines formed on another layer within the integrated circuit board. Accordingly, the layout of the overall circuit board is often dictated by the locations of the DC lines and RF signal lines.

It would be desirable to provide a surface mount crossover component that can be used at discrete locations anywhere on an integrated circuit board where two crossing conductor lines need to be isolated from one another. To date, however, there is no such surface mount crossover component available.

SUMMARY OF THE INVENTION

It is an object of the present invention to provide a surface mount crossover component that overcomes the disadvantages of the prior art.

It is another object of the present invention to provide a surface mount crossover component that provides sufficient electrical and capacitive isolation between two crossing conductor lines and can be manufactured easily and inexpensively.

To achieve these objects, a first embodiment of the present invention is a surface mount crossover component that is used to cross one conductor line over another conductor line that is already printed on an integrated circuit. The surface mount crossover component in accordance with this embodiment comprises a lowermost first dielectric layer, a ground plane layer disposed above the first dielectric layer, a second dielectric layer disposed above the ground plane layer, and a conductor line disposed above the second dielectric layer. The conductor line traverses the second dielectric layer to provide an electrical path from one end of the crossover component to an opposed end thereof. The dielectric layers and the ground plane layer electrically and capacitively isolate, respectively, the conductor lines from one another. Accordingly, current, such as an RF signal, can flow through the component via the conductor line without interference from current, such as a DC control signal, flowing through the conductor line printed on the integrated circuit.

A second embodiment of the present invention is a surface mount crossover component that is used to cross one conductor line over another conductor line formed in another functional surface mount component. The surface mount crossover component in accordance with the second embodiment comprises a functional surface mount component, a ground plane layer disposed on one of opposite major surfaces of the functional surface mount component, a dielectric layer disposed adjacent the ground plane layer, and a conductor line disposed adjacent the dielectric layer. The conductor line traverses the dielectric layer to provide an electrical path from one end of the crossover component to an opposed end thereof. The dielectric layer and the ground plane layer electrically and capacitively isolate, respectively, the conductor line from the conductor lines of the functional surface mount component. Accordingly, current can flow through the component via the conductor line without interference from current flowing through the conductor lines of the functional surface mount component.

A third embodiment of the present invention is a surface mount crossover component that is used to cross two conductor lines over one another within the body of the crossover component itself. The surface mount crossover component in accordance with the third embodiment comprises first and second conductor lines that are electrically and capacitively isolated from one another by an interposed ground plane.

A preferred form of the third embodiment includes a bottom ground plane layer, a first dielectric layer disposed above the bottom ground plane layer, a first conductor line disposed above the first dielectric layer, a second dielectric layer disposed above the first conductor line, an internal ground plane layer disposed above the second dielectric layer, a third dielectric layer disposed above the internal ground plane layer, a second conductor line disposed above the third dielectric layer, a fourth dielectric layer disposed above the second conductor line, and a top ground plane layer disposed above the fourth dielectric layer. The surface mount crossover component in accordance with this preferred embodiment of the present invention allows a first signal to be transmitted through the component via one of the first and second conductor lines with no substantial interference from a second signal transmitted via the other one of the first and second conductor lines. As with the other embodiments, the signals passing through the first and second conductor lines, respectively, are electrically and capacitively isolated from one another so that the presence of current passing through one of the conductor lines (e.g., DC current passing through a DC control line) does not interfere with the signal passing through the other conductor line (e.g., an RF signal passing through an RF line).

As used herein, the phrase "surface mount component" means a component that is to be mounted on a printed, integrated circuit board having printed circuit traces on at least one surface of the board. A surface mount component has termination contacts that are connected to the printed circuit traces by soldered connections between the terminals and the printed circuit traces. Unlike non-surface mount techniques, surface mount components typically do not include leads that extend through holes in the printed circuit board. As such, surface mount components are particularly well suited for automatic assembly. Surface mount components are mounted on continuous tapes formed into reels that are used by automatic assembly equipment to place the components on the printed circuit board. Typically, the components are temporarily attached to the board with an adhesive, solder paste, or the like prior to soldering, and then soldered in a single operation with the other surface mount components.

These and other features and advantages of the present invention will be better understood from the following detailed description taken in conjunction with the accompanying drawings.

BRIEF DESCRIPTION OF THE DRAWINGS

For a fuller understanding of the nature and objects of the invention, reference should be made to the following detailed description of a preferred mode of practicing the invention, read in connection with the accompanying drawings, in which.

DETAILED DESCRIPTION OF THE INVENTION

Figure 1:
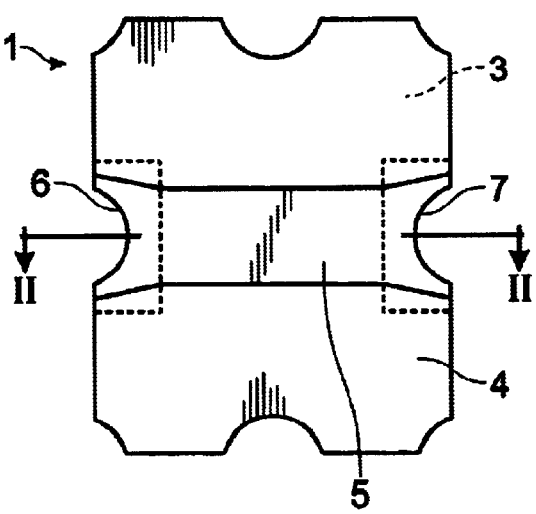
FIG. 1 is a top view of a surface mount crossover component in accordance with a first embodiment of the present invention.
Figure 2:
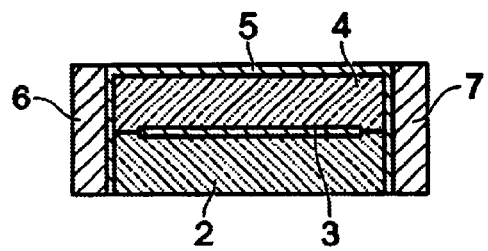
FIG. 2 is a cross-sectional view taken through line II—II of FIG. 1.

FIG. 1 is a top view, and FIG. 2 is a cross-sectional view taken along line II—II of FIG. 1, of a surface mount crossover component 1 in accordance with a first embodiment of the present invention. The component includes a lowermost first dielectric layer 2 (see FIG. 2), a ground plane layer 3 disposed above first dielectric layer 2, a second dielectric layer 4 disposed above ground plane layer 3, and a conductor line 5 disposed above second dielectric layer 4. Conductor line 5 traverses second dielectric layer 4 to provide an electrical path from one end of the crossover component to an opposed end thereof The overall shape of the component is generally that of a parallelogram, for reasons of manufacturing efficiency. It is understood, however, that the component can take any shape as long as the crossover function is achieved.

It can be appreciated from FIG. 2 that the surface mount crossover component can be manufactured using known materials (e.g., polymers, ceramics, and the like) and known strip line manufacturing techniques, such as those disclosed in U.S. Pat. 4,821,007, the entirety of which is incorporated herein by reference. After all the layers of the component are so formed and laminated, it is preferred to form so-called "half-barrel" termination contacts to allow the component to be soldered to a circuit board using surface mount techniques. Specifically, an input termination contact 6 is formed in electrical communication with one end of conductor line 5, and an output termination contact 7 is formed on the other end, again, in electrical communication with conductor line 5. As is known in the art, it is preferred to bevel the sides of the crossover component to provide reliable electrical contact with conductor line 5. FIGS. 1 and 2 show that ground plane layer 3 is recessed away from termination contacts 6 and 7 to insure electrical isolation between the termination contacts and the ground plane layer.

The crossover component of FIGS. 1 and 2 can be used anywhere it is necessary to cross one conductor line over another conductor line already printed on a circuit board. For example, the component could be positioned over a printed DC control line, and termination contacts 6 and 7 could be soldered to an RF line that needs to cross the DC control line. The RF signal would flow through the crossover component via conductor line 5 without interference from the DC control signal flowing through the conductor line printed on the circuit because dielectric layers 2, 4 and ground plane layer 3 electrically and capacitively isolate, respectively, the conductor lines from one another.

It will be apparent to the skilled circuit designer that the impedance of conductor line 5, including its termination contacts 6 and 7, must match the impedance of the system in which the crossover component will be used. For example, a typical impedance for a high power amplifier in a wireless communication system is 50 ohms. The impedance of conductor line 5, carrying the RF signal, is controlled by the dielectric constant and thickness of dielectric layer 4, as well as the cross-sectional dimensions of conductor line 5 itself. As such, it is relatively easy to form conductor line 5 having an impedance of 50 ohms.

The overall shape of the component, as shown in the plan view of FIG. 1, is generally that of a parallelogram, for reasons of manufacturing efficiency. It is understood, however, that the component can take any shape as long as the crossover function is achieved. It is also preferred that the component have an aspect ratio greater than 1 to facilitate correct orientation during automated assembly.

In the event several conductor lines need to cross the conductor line(s) printed on the 15 circuit, a plurality of laterally spaced conductor lines 5 could be formed on dielectric layer 4. Each conductor line would be accompanied by corresponding termination contacts, and appropriate recesses would be formed in ground plane layer 3 to insure electrical isolation, as described above. An alternative design such as this will be explained below with respect to FIGS. 8 and 9.

Figure 3:
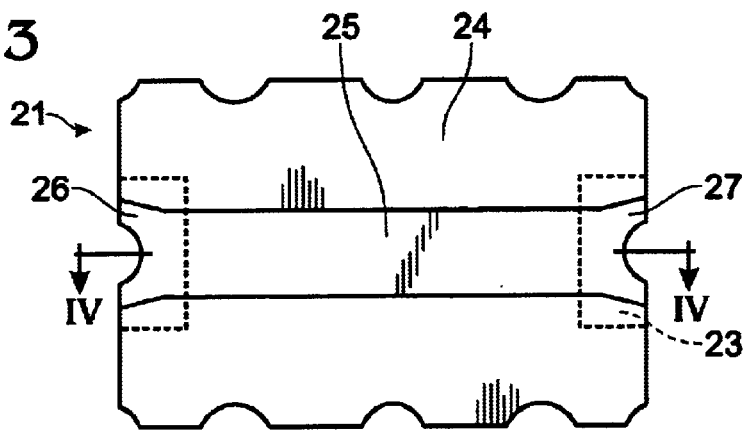
FIG. 3 is a top view of a surface mount crossover component in accordance with a second embodiment of the present invention.
Figure 4:
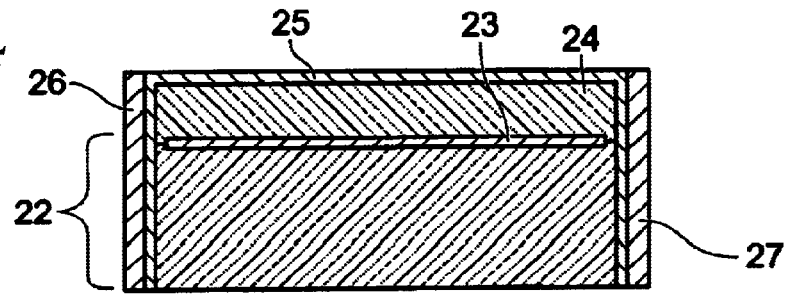
FIG. 4 is a cross-sectional view taken through line IV—IV of FIG. 3.

FIG. 3 is a top view, and FIG. 4 is a cross-sectional view taken along line IV—IV of FIG. 3, of a surface mount crossover component 21 in accordance with a second embodiment of the present invention. The component includes a functional surface mount component 22 (see FIG. 4), such as a XINGER® hibird coupler manufactured by Anaren Microwave, Inc. A ground plane layer 23 is disposed on the upper surface of functional surface mount component 22 (the ground plane layer 23 is usually formed as a component part of the functional surface mount component). A dielectric layer 24 is disposed above ground plane layer 23, and a conductor line 25 is disposed above dielectric layer 24. Layers 23, 24 and 25 could be formed on the bottom surface of component 22 and achieve the same result. Conductor line 25 traverses dielectric layer 24 to provide an electrical path from one end of the crossover component to an opposed end thereof. Dielectric layer 24 and ground plane layer 23 electrically and capacitively isolate, respectively, the conductor lines from one another. Accordingly, current can flow through the crossover component via conductor line 25 without interference from current flowing through conductor lines of functional surface mount component 22.

As in the first embodiment, an input termination contact 26 is formed in electrical communication with one end of conductor line 25, and an output termination contact 27 is formed on the other end, again, in electrical communication with conductor line 25. Additionally, ground plane layer 23 is recessed away from termination contacts 26 and 27 to insure electrical isolation between the termination contacts and the ground plane layer.

In the event several conductor lines need to cross the conductor line(s) of functional surface mount component 22, a plurality of laterally spaced conductor lines 25 could be formed on dielectric layer 24. Each conductor line would be accompanied by corresponding termination contacts, and appropriate recesses would be formed in ground plane layer 23 to insure electrical isolation, as described above.

Figure 5:
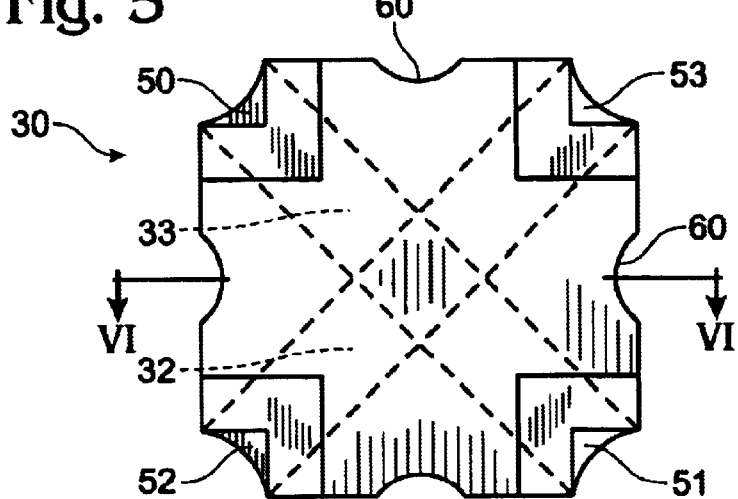
FIG. 5 is a top view of a surface mount crossover component in accordance with a third embodiment of the present invention.
Figure 6:
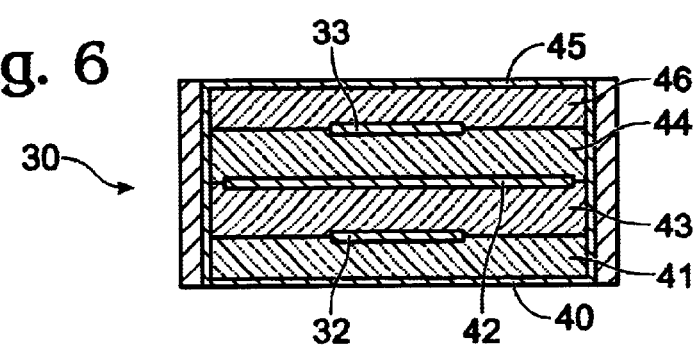
FIG. 6 is a cross-sectional view taken through line VI—VI of FIG. 5.
Figure 7:
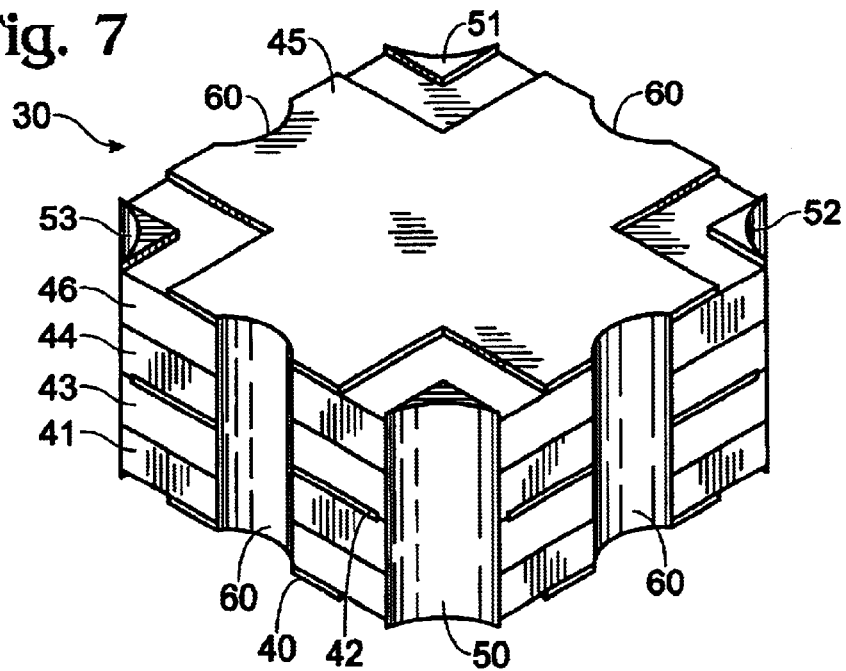
FIG. 7 is a perspective view of the surface mount crossover component shown in FIG. 5.

FIG. 5 is a top view, FIG. 6 is a cross-sectional view taken through line VI—VI of FIG. 5, and FIG. 7 is a perspective view of a surface mount crossover component in accordance with a third embodiment of the present invention. This surface mount crossover component is used to cross two conductor lines over one another within the body of the crossover component itself. The surface mount crossover component 30 comprises first conductor line 32 and second conductor line 33 (see FIGS. 2 and 6) that are capacitively isolated from one another by an interposed ground plane 42. The first conductor line 32 and second conductor line 33 extend along opposite diagonals of the component to allow appropriate spacing between the external termination points of the respective conductor lines. It is understood, however, that the conductor lines could extend from opposite sides of the component and still achieve the intended crossover function.

FIG. 6 is a cross-sectional view taken along line VI—VI of FIG. 5, and shows the individual layers of the surface mount crossover component. The component includes a bottom ground plane layer 40 that is electrically isolated from first conductor line 32 via an interposed first dielectric layer 41. An internal ground plane layer 42 is electrically isolated from first conductor line 32 via a second dielectric layer 43. The internal ground plane layer 42 is also electrically isolated from second conductor line 33 via an interposed dielectric layer 44. A top ground plane layer 45 is electrically isolated from second conductor line 33 via an interposed fourth dielectric layer 46.

The four dielectric layers insure that the first conductor 32, second conductor 33 and ground plane layers 40, 42, 45 are electrically isolated from one another within the body of the crossover component. The internal ground plane layer 42 insures that the first conductor line 32 is also capacitively isolated from the second conductor line 33. In this manner, a first signal (e.g., an RF signal) can be transmitted through the crossover component via first conductor line 32 without encountering any substantial interference from a second signal (e.g., a DC control signal) passing through the crossover component via second conductor line 33.

FIG. 7 is a perspective view of the surface mount crossover component shown in FIGS. 5 and 6. It can be appreciated from FIG. 7 that the crossover component is small and compact in size, thus facilitating its discrete use on an integrated circuit board at all locations where two distinct conductor lines cross one another.

As in the case of the other embodiments described above, the surface mount crossover component of FIGS. 5–7 can be manufactured using known materials and techniques. In the case of FIG. 6, bottom ground plane layer 40 is formed on the bottom of first dielectric layer 41. The first conductor line 32 can be formed on the top surface of first dielectric layer 41 or the bottom surface of second dielectric layer 43. The same manufacturing options apply to the second conductor line 33. That is, it can be formed on the bottom surface of fourth dielectric layer 46 or the top surface of third dielectric layer 44. Incidentally, while a dotted line is used to show the boundaries between layers 41 and 43, and layers 44 and 46, it is likely that no substantial boundary layer will exist in the finally manufactured component of any embodiment.

The internal ground plane layer 42 can either be formed on the top surface of second dielectric layer 43 or the bottom surface of third dielectric layer 44. It is also possible to form half of the internal ground plane layer 42 on the upper surface of second dielectric layer 43 and the other half on the lower surface of third dielectric layer 44. In this manner, the lower section of the crossover component, which includes layers 40, 41, 32, 43 and one-half of layer 42, and the upper section of the crossover component, which includes layers 45, 46, 33, 44 and one-half of layer 42, could be formed as identical strip line components, and the upper section could be inverted and laminated on the lower section to form the component shown in cross-section in FIG. 6. Of course, one of the upper or lower sections would have to be rotated 90° to insure that the first conductor line 32 and second conductor line 33 cross each other as shown in FIG. 5.

After all the layers of the component are formed and laminated, a first input termination contact 50 is formed on the upper left-hand beveled corner of the component as shown in FIG. 5, and a first output termination contact 51 is formed on the opposite corner, both in electrical communication with the second conductor line 33. A second input termination contact 52 and a second output termination contact 53 are formed in a similar manner in electrical communication with the first conductor line 32. As is known in the art, it is preferred to bevel the corners of the crossover component to provide reliable electrical contact with the first and second conductor lines 32, 33.

FIGS. 5 and 7 also show that the termination contacts extend onto the upper is and lower surfaces of the crossover component. As best seen in FIG. 7, the top and bottom ground plane layers 45, 40 are formed in the shape of a cross and are recessed away from those portions of the termination contacts that reside on the top and bottom surfaces of the crossover component. This insures electrical isolation between the top and bottom ground plane layers and the adjacent termination contacts. The orientation and shape of internal ground plane layer 42 is the same as that of top and bottom ground plane layers 45, 40 shown in FIGS. 5 and 7. So-called "half-barrel" termination contacts 60 are formed on each side of the crossover component to provide sufficient electrical contact with the ground plane layers, particularly the internal ground plane layer 42.

While the input and output termination contacts shown in FIGS. 5 and 7 extend along the entire height of the crossover component, it is possible to form the input and output contacts for the lower, first conductor line 32 to a height that equals the position of the first conductor line within the stacked structure of the crossover component. While such a design alteration should improve the RF performance of the crossover component, it would require that the component be properly oriented before mounting on an integrated circuit board. That is, while either the top or the bottom ground plane layer of the component shown in FIGS. 5–7 could be mounted to an integrated circuit board, the alternative design described above would require that the bottom ground plane 40 be mounted on the integrated circuit board, so that the RF line, for example, on the integrated circuit board could be soldered, using surface mount techniques, to the input and output termination contacts in communication with the first conductor line 32.

Figure 8:
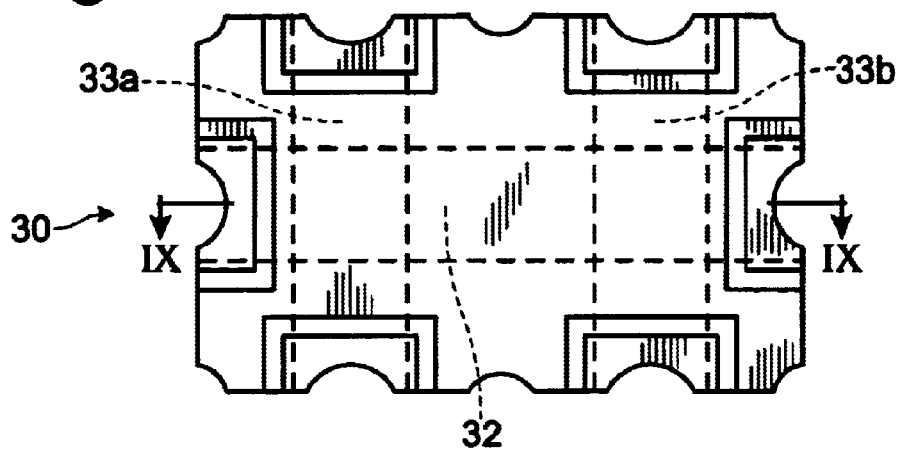
FIG. 8 is a top view of an alternative form of the surface mount crossover component in accordance with the third embodiment of the present invention.
Figure 9:
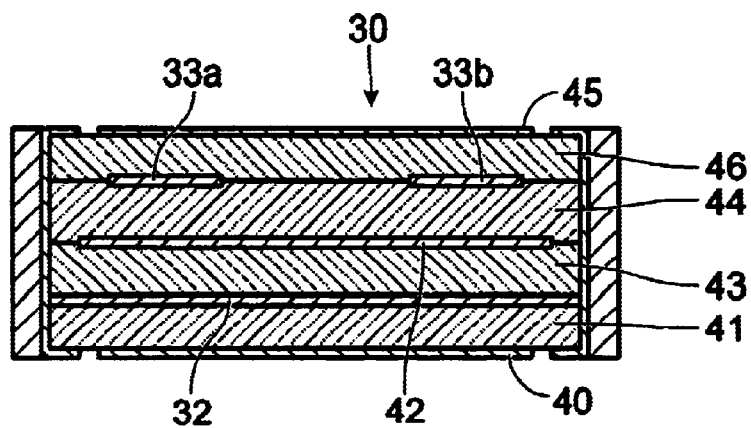
FIG. 9 is a cross-sectional view taken through line IX—IX of FIG. 8.

FIG. 8 is a top view, and FIG. 9 is a cross-sectional view taken along line IX—IX of FIG. 8, of an alternative surface mount crossover component 30 in accordance with the third embodiment of the present invention. Like reference numerals designate like components in FIGS. 5–9 and may not be described in detail for all figures. The surface mount component shown in FIGS. 8 and 9 includes a first conductor line 32 and two second conductor lines 33a and 33b. This component can be used when two conductor lines (e.g., RF signal lines) must cross another conductor line 15 (e.g., a DC supply/control line).

Figure 10:
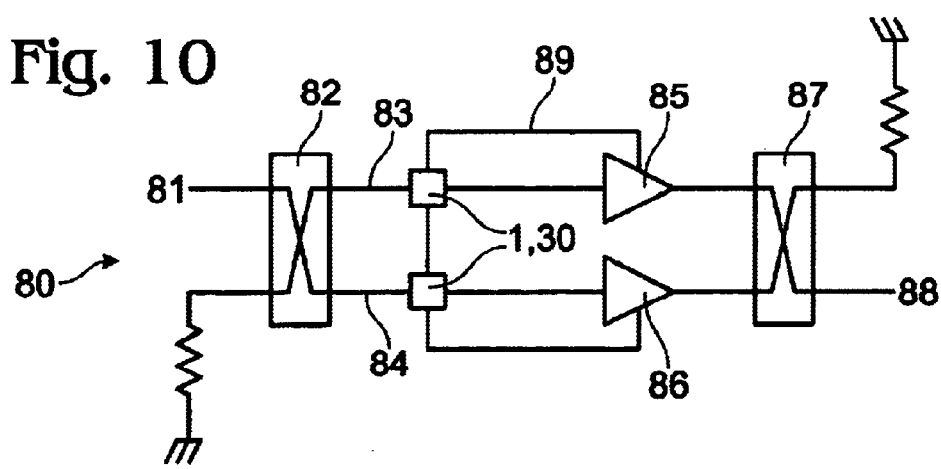
FIG. 10 is an exemplary RF integrated circuit incorporating the surface mount crossover component of the present invention.

FIG. 10 shows an exemplary integrated circuit board that is commonly used in high power amplifiers of wireless communication systems. The circuit board 80 includes an RF signal line 81, which passes through a hybrid coupler 82, such as a XINGER® hybrid coupler manufactured by Anaren Microwave, Inc. The hybrid coupler splits the signal into two signals carried by conductor lines 83 and 84. The signals pass through semiconductor amplifiers 85 and 86, before being re-combined by a second hybrid coupler 87, to form an output signal carried by conductor line 88. Each amplifier 85 and 86 includes a DC supply/control line 89. It can be seen from FIG. 10 that control line 89 must cross RF lines 83 and 84 to reach amplifier 86, for example.

In accordance with the present invention, if DC control line 89 is printed on the circuit board, then surface mount crossover component 1 could be mounted easily to the surface of the integrated circuit board to allow the RF lines 83 and 84 (passing through conductor lines 5) to cross DC control line 89. Two surface mount components could be used, or two conductor lines could be formed on one crossover component 1 to allow both RF lines 83 and 84 to cross line 89 in a single component. Another alternative would be to break the DC control line 89 and use two crossover components 30 to allow RF lines 83 and 84 (passing through conductor lines 33—FIG. 5 to cross DC control line 89 (passing through conductor line 32—FIG. 5). Yet another alternative would be to run DC control line 89 over hybrid coupler 82 using crossover component 21 shown in FIGS. 3 and 4.

It is clear from the above description that the surface mount crossover components of the present invention can be mounted easily to the surface of an integrated circuit board to allow signal lines to cross one another substantially free of interference. In particular, the surface mount crossover components in accordance with the present invention provide an easy and inexpensive solution to the problem of crossing DC control lines and RF signal lines. It is no longer necessary to bury at least one of the lines within the integrated circuit board itself, as discussed in the '375 patent. Accordingly, a substantial cost savings can be realized by using the surface mount crossover component according to the present invention.

The surface mount crossover component of the present invention also provides superior microwave performance when compared to the RF crossover described in the '375 patent, because the RF signal line is capacitively isolated from the DC control line by the presence of an internal ground plane layer interposed between the conductor line carrying the RF signal and the conductor line carrying the DC control signal.

While the present invention has been particularly shown and described with reference to the preferred mode as illustrated in the drawings, it will be understood by one skilled in the art that various changes in detail may be effected therein without departing from the spirit and scope of the invention as defined by the claims.

I claim:

1. A crossover component, comprising:

a bottom ground plane layer;

a first dielectric layer disposed above said bottom ground plane layer;

at least one first conductor line disposed above said first dielectric layer;

a second dielectric layer disposed above said at least one first conductor line;

an internal ground plane layer disposed above said second dielectric layer;

a third dielectric layer disposed above said internal ground plane layer;

at least one second conductor line disposed above said third dielectric layer;

a fourth dielectric layer disposed above said at least one second conductor line; and a top ground plane layer disposed above said fourth dielectric layer;

wherein a current flowing through said surface mount crossover component via one of said at least one first and second conductor lines encounters no substantial interference from current flowing through the other one of said at least one first and second conductor lines, further comprising a first input termination contact in electrical communication with an input end of said at least one first conductor line, a first output termination contact in electrical communication with an output en of said at least one first conductor line, a second input termination contact in electrical communication with an input end of said at least one second conductor lines, and a second output termination contact in electrical communication with an output end of said at least in said component is generally the shape of a parallelepiped with said first input and output termination contacts arranged along one pair of diagonally opposed corners of the crossover component, and the second input and output termination contacts arranged along the other pair of diagonally opposed corners of the crossover component.

2. The crossover component of claim 1, wherein said ground plane layers are electrically isolated from said termination contacts.

3. The surface mount crossover component of claim 1, wherein said first conductor line extends along a first direction and said second conductor line extends along a second direction crossing said first direction.

4. A crossover component comprising:
 a functional surface mount component including a first conductor line;
 a ground plane layer disposed on one of opposite major surfaces of said functional surface mount component;
 a dielectric layer disposed adjacent said ground plane layer; and
 a second conductor line disposed adjacent said dielectric layer, said second conductor line traversing said dielectric layer to provide an electrical path from one end of the crossover component to an opposed end thereof,
 wherein said dielectric layer and said ground plane layer electrically and capacitively isolate, respectively, said first conductor line and said second conductor line from one another, such that current flowing through the crossover component via said second conductor line encounters no substantial interference from current flowing through said first conductor line, further comprising a third conductor line disposed adjacent said dielectric layer, said third conductor line coplanar with said second conductor line and spaced laterally from said second conductor line, said third conductor line traversing said dielectric layer to provide a second electrical path from the one end of the crossover component to the opposed end thereof.

5. The crossover component of claim 4, further comprising at least two input termination contacts, each said input termination contact in electrical communication with an input end of each of said second conductor line and said third conductor line, and at least two output termination contacts, each said output termination contact in electrical communication with an output end of each of said second conductor line and said third conductor line, wherein said ground plane layer is electrically isolated from said at least two input termination contacts and said at least two output termination contacts.

6. The crossover component of claim 4, further comprising an input termination contact in electrical communication with an input end of each of said second conductor line and said third conductor line, and an output termination contact in electrical communication with an output end of each of said second conductor line and said third conductor line, wherein said ground plane layer is electrically isolated from each of said input termination contacts and each of said output termination contacts.

* * * * *

UNITED STATES PATENT AND TRADEMARK OFFICE
CERTIFICATE OF CORRECTION

PATENT NO. : 6,734,750 B1
DATED : May 11, 2004
INVENTOR(S) : Hans Peter Ostergaard It is certified that error appears in the above-identified patent and that said Letters Patent is hereby corrected as shown below:

Column 9,
Line 2, after "output" delete "en" and substitute therefor -- end --;
Line 7, after "least" delete "in" and insert -- one second conductor lines wherein --.

Signed and Sealed this

Twenty-third Day of November, 2004

JON W. DUDAS
*Director of the United States Patent and Trademark Office*